(12) United States Patent
Dhuse et al.

(10) Patent No.: US 10,511,665 B2
(45) Date of Patent: Dec. 17, 2019

(54) EFFICIENT RESOURCE RECLAMATION AFTER DELETION OF SLICE FROM COMMON FILE

(71) Applicant: International Business Machines Corporation, Armonk, NY (US)

(72) Inventors: Greg R. Dhuse, Chicago, IL (US); Ilya Volvovski, Chicago, IL (US); Joseph M. Kaczmarek, Chicago, IL (US); Trevor J. Vossberg, Chicago, IL (US)

(73) Assignee: PURE STORAGE, INC., Mountain View, CA (US)

( * ) Notice: Subject to any disclaimer, the term of this patent is extended or adjusted under 35 U.S.C. 154(b) by 51 days.

(21) Appl. No.: 15/838,725

(22) Filed: Dec. 12, 2017

(65) Prior Publication Data
US 2018/0103103 A1   Apr. 12, 2018

Related U.S. Application Data

(63) Continuation-in-part of application No. 15/812,706, filed on Nov. 14, 2017, now Pat. No. 10,362,111, (Continued)

(51) Int. Cl.
*H03M 13/15* (2006.01)
*H04L 29/08* (2006.01)
(Continued)

(52) U.S. Cl.
CPC .... *H04L 67/1097* (2013.01); *H03M 13/3761* (2013.01); *H03M 13/09* (2013.01); *H03M 13/1515* (2013.01)

(58) Field of Classification Search
CPC .................................................. H03M 13/15
(Continued)

(56) References Cited

U.S. PATENT DOCUMENTS

| 4,092,732 A | 5/1978 | Ouchi |
| 5,454,101 A | 9/1995 | Mackay et al. |

(Continued)

OTHER PUBLICATIONS

Chung; An Automatic Data Segmentation Method for 3D Measured Data Points; National Taiwan University; pp. 1-8; 1998.
(Continued)

*Primary Examiner* — Fritz Alphonse
(74) *Attorney, Agent, or Firm* — Garlick & Markison; Edward J. Marshall

(57) ABSTRACT

A distributed storage network (DSN) employs one or more distributed storage task execution (DST EX) units for dispersed storage of encoded data slices. A delete-slice request associated with a first encoded data slice is received at a DST EX unit, the encoded data slice is packed into a common file with other encoded data slices, and the common file is stored in a distributed storage (DS) memory included in the DST EX unit. Each encoded data slice packed into the common file is associated with a file offset within the common file. The DST EX unit identifies a file offset of the first encoded data slice within the common file. The DST EX unit releases the portion of the DS memory associated with the particular file offset within the common file to a file system maintained by the DST EX unit.

20 Claims, 7 Drawing Sheets

Related U.S. Application Data which is a continuation of application No. 14/956,818, filed on Dec. 2, 2015, now Pat. No. 9,826,038.

(60) Provisional application No. 62/109,712, filed on Jan. 30, 2015.

(51) Int. Cl.
*H03M 13/37* (2006.01)
*H03M 13/09* (2006.01)

(58) Field of Classification Search
USPC .................................... 714/759, 762, 760
See application file for complete search history.

(56) References Cited

U.S. PATENT DOCUMENTS

| | | | |
|---|---|---|---|
| 5,485,474 | A | 1/1996 | Rabin |
| 5,774,643 | A | 6/1998 | Lubbers et al. |
| 5,802,364 | A | 9/1998 | Senator et al. |
| 5,809,285 | A | 9/1998 | Hilland |
| 5,890,156 | A | 3/1999 | Rekieta et al. |
| 5,987,622 | A | 11/1999 | Lo Verso et al. |
| 5,991,414 | A | 11/1999 | Garay et al. |
| 6,012,159 | A | 1/2000 | Fischer et al. |
| 6,058,454 | A | 5/2000 | Gerlach et al. |
| 6,128,277 | A | 10/2000 | Bruck et al. |
| 6,175,571 | B1 | 1/2001 | Haddock et al. |
| 6,192,472 | B1 | 2/2001 | Garay et al. |
| 6,256,688 | B1 | 7/2001 | Suetaka et al. |
| 6,272,658 | B1 | 8/2001 | Steele et al. |
| 6,301,604 | B1 | 10/2001 | Nojima |
| 6,356,949 | B1 | 3/2002 | Katsandres et al. |
| 6,366,995 | B1 | 4/2002 | Vilkov et al. |
| 6,374,336 | B1 | 4/2002 | Peters et al. |
| 6,415,373 | B1 | 7/2002 | Peters et al. |
| 6,418,539 | B1 | 7/2002 | Walker |
| 6,449,688 | B1 | 9/2002 | Peters et al. |
| 6,567,948 | B2 | 5/2003 | Steele et al. |
| 6,571,282 | B1 | 5/2003 | Bowman-Amuah |
| 6,609,223 | B1 | 8/2003 | Wolfgang |
| 6,718,361 | B1 | 4/2004 | Basani et al. |
| 6,760,808 | B2 | 7/2004 | Peters et al. |
| 6,785,768 | B2 | 8/2004 | Peters et al. |
| 6,785,783 | B2 | 8/2004 | Buckland |
| 6,826,711 | B2 | 11/2004 | Moulton et al. |
| 6,879,596 | B1 | 4/2005 | Dooply |
| 7,003,688 | B1 | 2/2006 | Pittelkow et al. |
| 7,024,451 | B2 | 4/2006 | Jorgenson |
| 7,024,609 | B2 | 4/2006 | Wolfgang et al. |
| 7,080,101 | B1 | 7/2006 | Watson et al. |
| 7,103,824 | B2 | 9/2006 | Halford |
| 7,103,915 | B2 | 9/2006 | Redlich et al. |
| 7,111,115 | B2 | 9/2006 | Peters et al. |
| 7,140,044 | B2 | 11/2006 | Redlich et al. |
| 7,146,644 | B2 | 12/2006 | Redlich et al. |
| 7,171,493 | B2 | 1/2007 | Shu et al. |
| 7,222,133 | B1 | 5/2007 | Raipurkar et al. |
| 7,240,236 | B2 | 7/2007 | Cutts et al. |
| 7,272,613 | B2 | 9/2007 | Sim et al. |
| 7,636,724 | B2 | 12/2009 | de la Torre et al. |
| 9,094,402 | B2 * | 7/2015 | Resch ................. H04L 9/085 |
| 2002/0062422 | A1 | 5/2002 | Butterworth et al. |
| 2002/0166079 | A1 | 11/2002 | Ulrich et al. |
| 2003/0018927 | A1 | 1/2003 | Gadir et al. |
| 2003/0037261 | A1 | 2/2003 | Meffert et al. |
| 2003/0065617 | A1 | 4/2003 | Watkins et al. |
| 2003/0084020 | A1 | 5/2003 | Shu |
| 2004/0024963 | A1 | 2/2004 | Talagala et al. |
| 2004/0122917 | A1 | 6/2004 | Menon et al. |
| 2004/0215998 | A1 | 10/2004 | Buxton et al. |
| 2004/0228493 | A1 | 11/2004 | Ma |
| 2005/0100022 | A1 | 5/2005 | Ramprashad |
| 2005/0114594 | A1 | 5/2005 | Corbett et al. |
| 2005/0125593 | A1 | 6/2005 | Karpoff et al. |
| 2005/0131993 | A1 | 6/2005 | Fatula |
| 2005/0132070 | A1 | 6/2005 | Redlich et al. |
| 2005/0144382 | A1 | 6/2005 | Schmisseur |
| 2005/0229069 | A1 | 10/2005 | Hassner et al. |
| 2006/0047907 | A1 | 3/2006 | Shiga et al. |
| 2006/0136448 | A1 | 6/2006 | Cialini et al. |
| 2006/0156059 | A1 | 7/2006 | Kitamura |
| 2006/0224603 | A1 | 10/2006 | Correll |
| 2007/0079081 | A1 | 4/2007 | Gladwin et al. |
| 2007/0079082 | A1 | 4/2007 | Gladwin et al. |
| 2007/0079083 | A1 | 4/2007 | Gladwin et al. |
| 2007/0088970 | A1 | 4/2007 | Buxton et al. |
| 2007/0174192 | A1 | 7/2007 | Gladwin et al. |
| 2007/0214285 | A1 | 9/2007 | Au et al. |
| 2007/0234110 | A1 | 10/2007 | Soran et al. |
| 2007/0283167 | A1 | 12/2007 | Venters et al. |
| 2009/0094251 | A1 | 4/2009 | Gladwin et al. |
| 2009/0094318 | A1 | 4/2009 | Gladwin et al. |
| 2010/0023524 | A1 | 1/2010 | Gladwin et al. |
| 2015/0227414 | A1 | 8/2015 | Varma |
| 2016/0117219 | A1 | 4/2016 | Halbert et al. |
| 2016/0357635 | A1 * | 12/2016 | Dhuse ................. G06F 16/1824 |
| 2018/0046544 | A1 * | 2/2018 | Resch ................. G06F 3/0619 |

OTHER PUBLICATIONS

Harrison; Lightweight Directory Access Protocol (LDAP): Authentication Methods and Security Mechanisms; IETF Network Working Group; RFC 4513; Jun. 2006; pp. 1-32.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

Legg; Lightweight Directory Access Protocol (LDAP): Syntaxes and Matching Rules; IETF Network Working Group; RFC 4517; Jun. 2006; pp. 1-50.

Plank, T1: Erasure Codes for Storage Applications; FAST2005, 4th Usenix Conference on File Storage Technologies; Dec. 13-16, 2005; pp. 1-74.

Rabin; Efficient Dispersal of Information for Security, Load Balancing, and Fault Tolerance; Journal of the Association for Computer Machinery; vol. 36, No. 2; Apr. 1989; pp. 335-348.

Satran, et al.; Internet Small Computer Systems Interface (iSCSI); IETF Network Working Group; RFC 3720; Apr. 2004; pp. 1-257.

Sciberras; Lightweight Directory Access Protocol (LDAP): Schema for User Applications; IETF Network Working Group; RFC 4519; Jun. 2006; pp. 1-33.

Sermersheim; Lightweight Directory Access Protocol (LDAP): The Protocol; IETF Network Working Group; RFC 4511; Jun. 2006; pp. 1-68.

Shamir; How to Share a Secret; Communications of the ACM; vol. 22, No. 11; Nov. 1979; pp. 612-613.

Smith; Lightweight Directory Access Protocol (LDAP): String Representation of Search Filters; IETF Network Working Group; RFC 4515; Jun. 2006; pp. 1-12.

Smith; Lightweight Directory Access Protocol (LDAP): Uniform Resource Locator; IETF Network Working Group; RFC 4516; Jun. 2006; pp. 1-15.

Wildi; Java iSCSi Initiator; Master Thesis; Department of Computer and Information Science, University of Konstanz; Feb. 2007; 60 pgs.

Xin, et al.; Evaluation of Distributed Recovery in Large-Scale Storage Systems; 13th IEEE International Symposium on High Performance Distributed Computing; Jun. 2004; pp. 172-181.

Zeilenga; Lightweight Directory Access Protocol (LDAP): Internationalized String Preparation; IETF Network Norking Group; RFC 4518; Jun. 2006; pp. 1-14.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): Directory Information Models; IETF Network Working Group; RFC 4512; Jun. 2006; pp. 1-49.

(56) References Cited

OTHER PUBLICATIONS

Zeilenga; Lightweight Directory Access Protocol (LDAP): String Representation of Distinguished Names; IETF Network Working Group; RFC 4514; Jun. 2006; pp. 1-15.

* cited by examiner distributed, or dispersed, storage network (DSN) 10

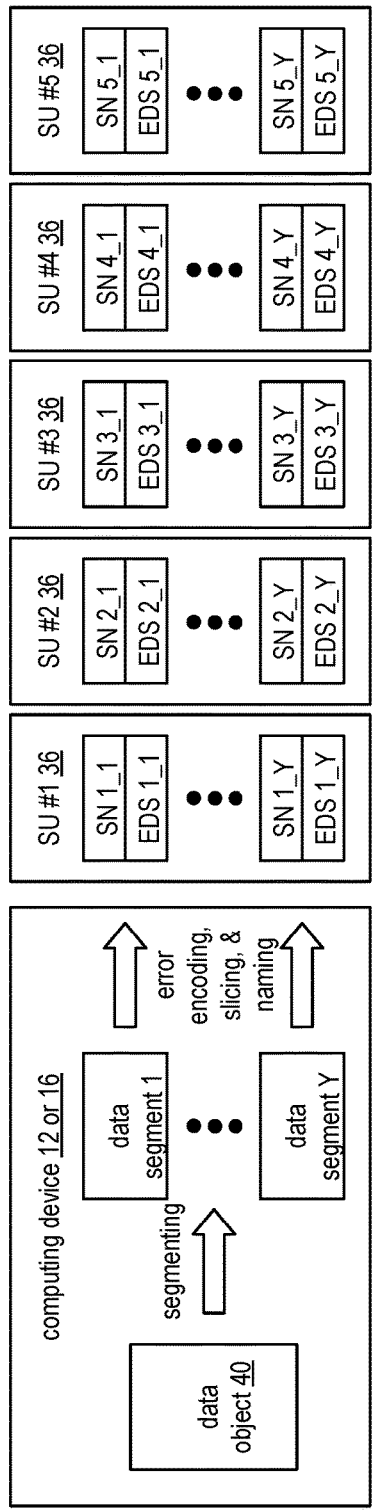
FIG. 3
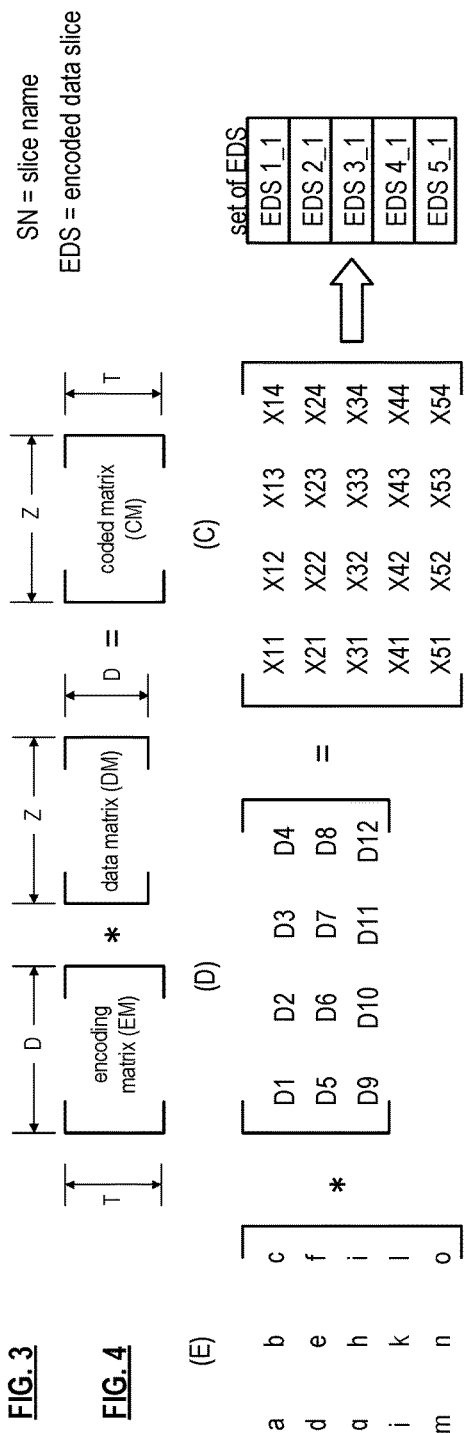
FIG. 4
FIG. 5
| pillar # | data segment # | slice name 80 | | rev. info |
|---|---|---|---|---|
| | | vault ID | data object ID | |
FIG. 6

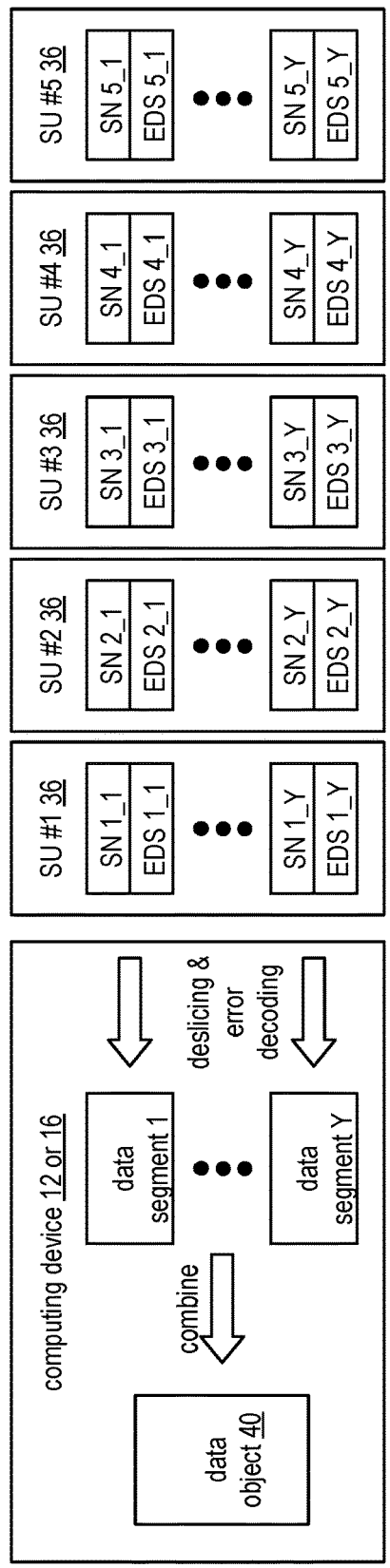

EFFICIENT RESOURCE RECLAMATION AFTER DELETION OF SLICE FROM COMMON FILE

CROSS-REFERENCE TO RELATED APPLICATIONS

The present U.S. Utility Patent Application claims priority pursuant to 35 U.S.C. § 120 as a continuation-in-part of U.S. Utility application Ser. No. 15/812,706 entitled "SELECTING A DATA STORAGE RESOURCE OF A DISPERSED STORAGE NETWORK" filed Nov. 14, 2017, which claims priority pursuant to 35 U.S.C. § 120 as a continuation of U.S. Utility application Ser. No. 14/956,818 entitled "SELECTING A DATA STORAGE RESOURCE OF A DISPERSED STORAGE NETWORK" filed Dec. 2, 2015, now U.S. Pat. No. 9,826,038 issued on Nov. 21, 2017, which claims priority pursuant to 35 U.S.C. § 119(e) to U.S. Provisional Application No. 62/109,712, entitled "UTILIZING ALTERNATE STORAGE RESOURCES WITHIN A DISPERSED STORAGE NETWORK," filed Jan. 30, 2015, all of which are hereby incorporated herein by reference in their entirety and made part of the present U.S. Utility Patent Application for all purposes.

BACKGROUND

Technical Field

This invention relates generally to computer networks and more particularly to dispersing error encoded data.

DESCRIPTION OF RELATED ART

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

In modern file systems, sparse files are files whose total logical size may be greater than the actual physical utilization of the file. For example, a sparse file may be initialized as 1 GB, even though only a few bytes, at one offset within that file, have been written. Reads from positions in the file which have not been written to may return some pre-defined value such as all zeros. While the file system only allocates and uses blocks for those positions in the file where data has been written. Once every position in the file has been written to at least once, the file is no longer sparse and its logical size is equal to its physical utilization.

Some storage systems may store multiple pieces of data within a single file, to reduce file system overhead, to make locating data more efficient, or to make writing more local and faster. But in the context of non-sparse files, in cases where one of the pieces of data must be deleted from within the file, there are a few approaches that can be used. As a first option, the piece of data within the file can be left in-place, and marked as deleted. But this technique does not allow deletes do not recover storage. A second option is to rewrite the remaining data to a new file, and then delete the old file, but this can cause an excessive number of input/output (I/O) operations in response to a delete.

BRIEF DESCRIPTION OF THE DRAWINGS

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

FIG. 7 is a schematic block diagram of an example of dispersed storage error decoding of data in accordance with the present invention;

FIG. 8 is a schematic block diagram of a generic example of an error decoding function in accordance with the present invention;

DETAILED DESCRIPTION

Figure 1:
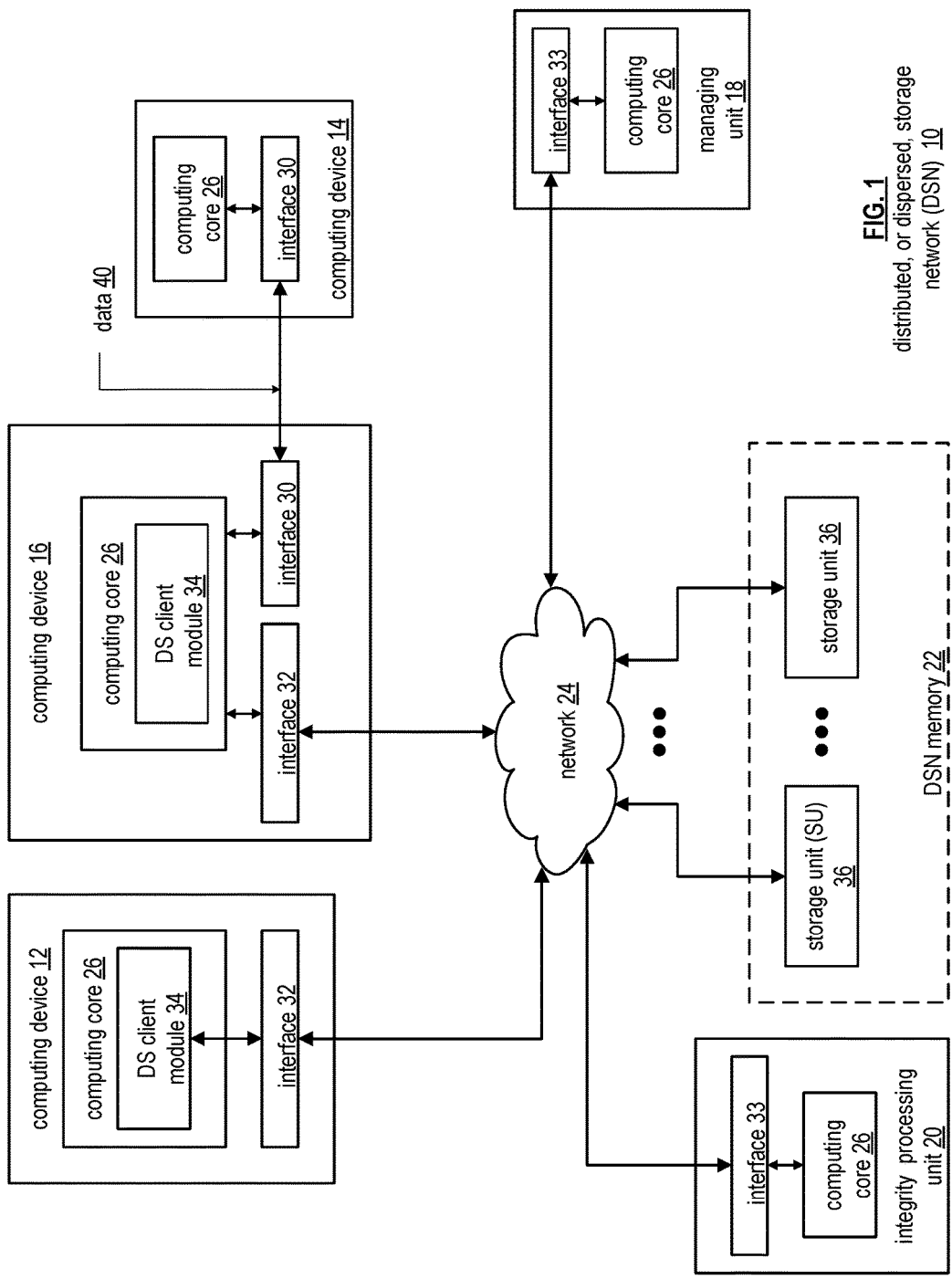
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
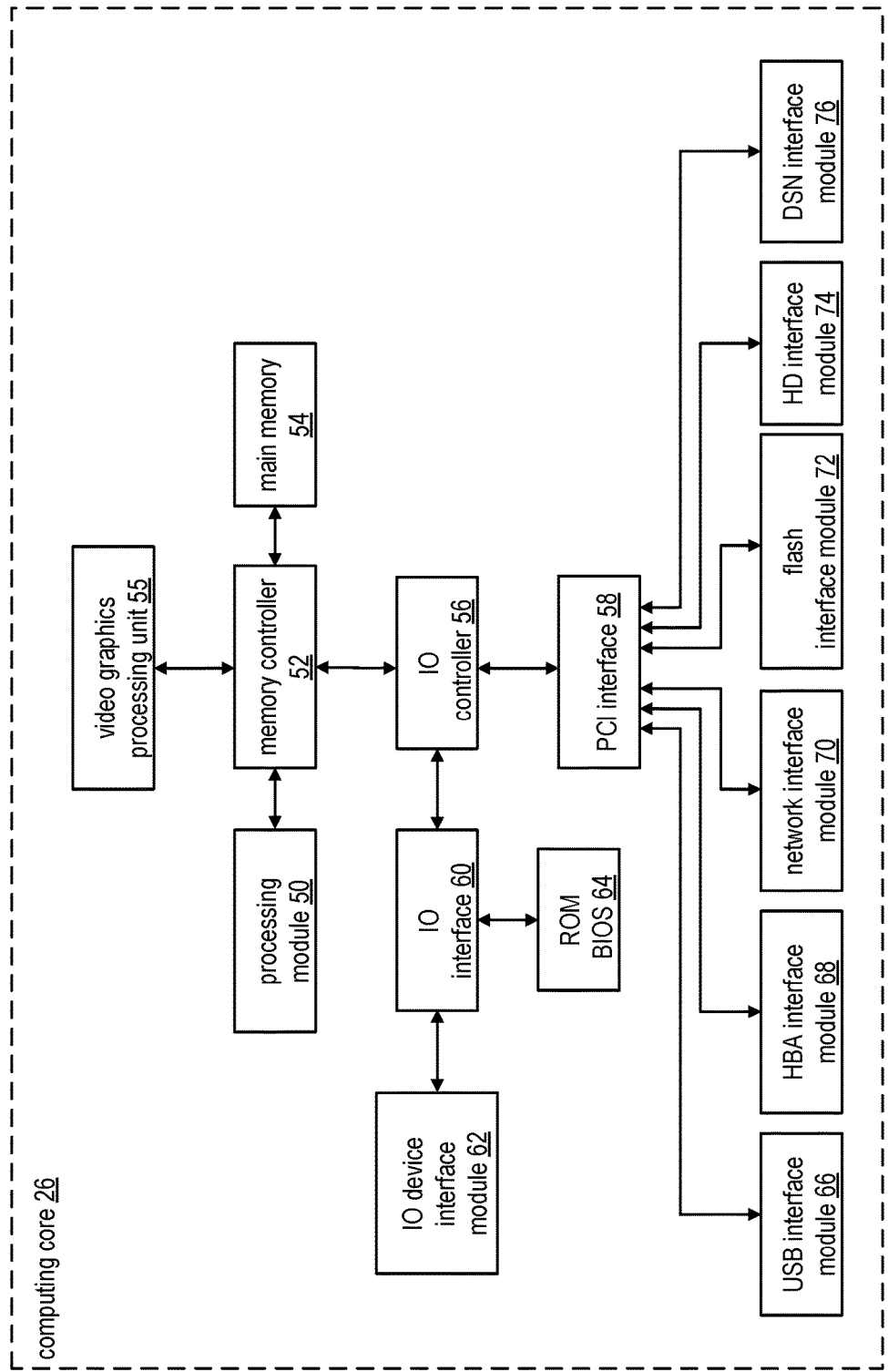
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 and 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data (e.g., data 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate a per-access billing information. In another instance, the managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
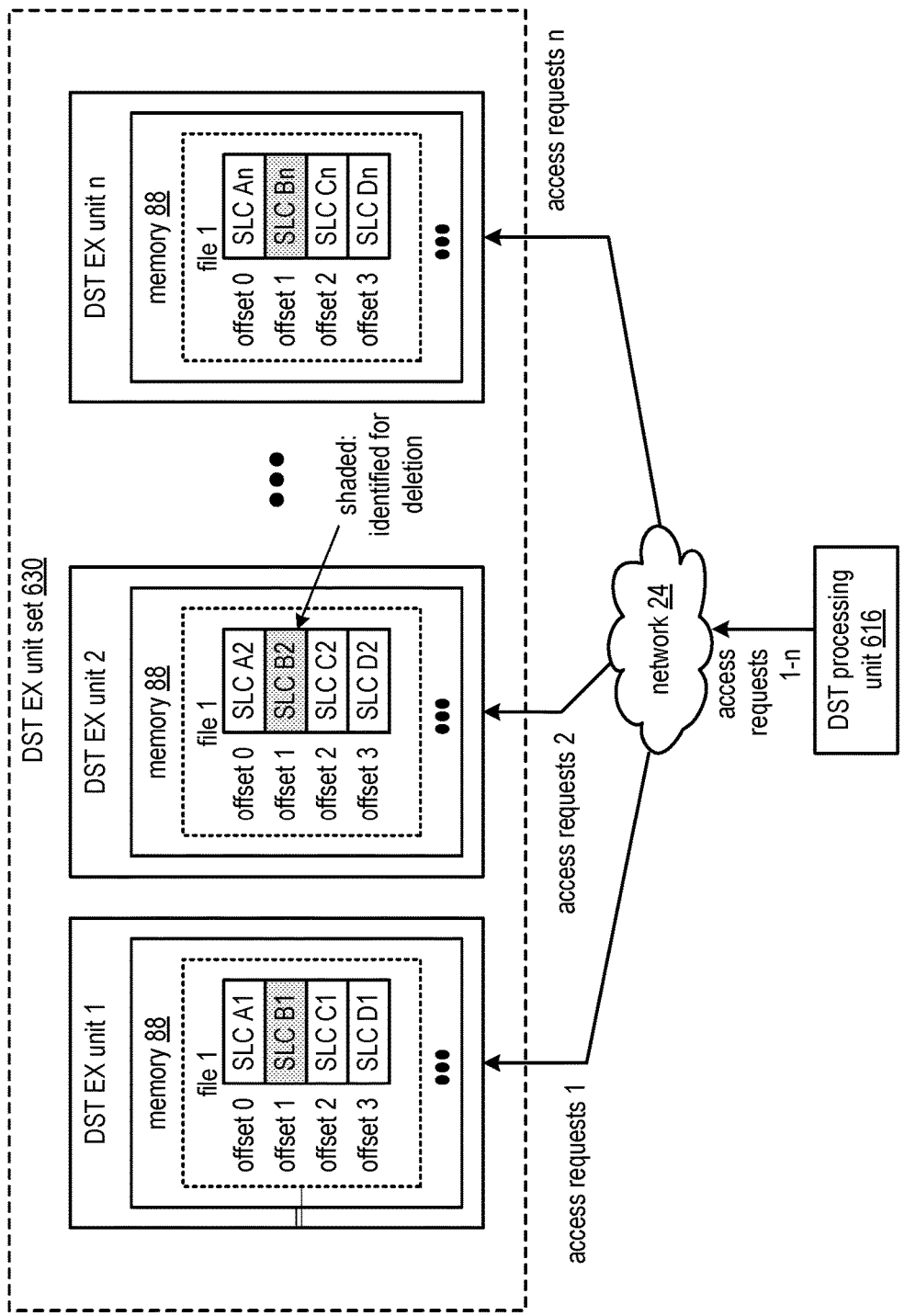
FIG. 9-10 are schematic block diagrams of embodiments of a dispersed storage network (DSN) in accordance with the present invention.
Figure 10:
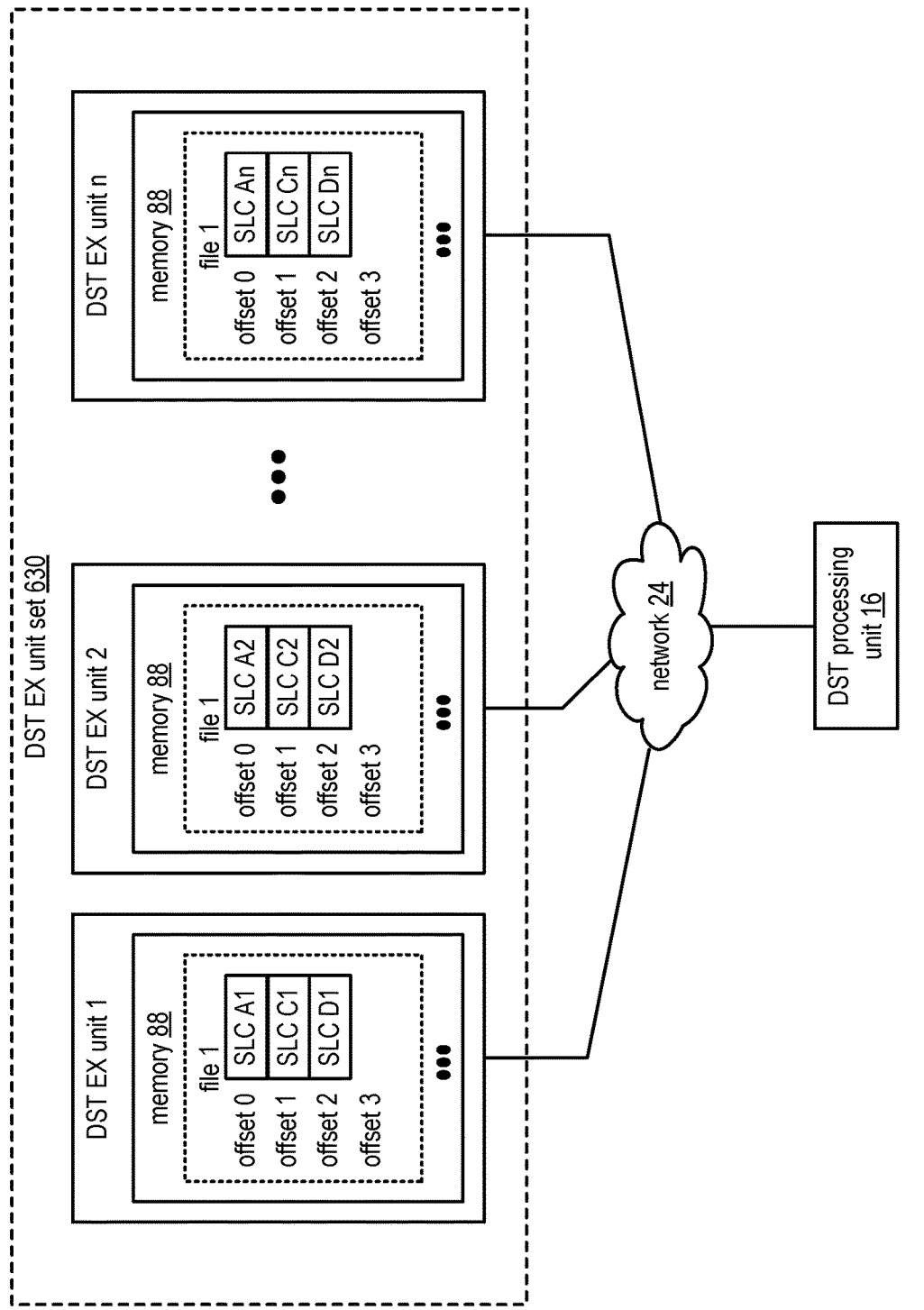
Figure 11:
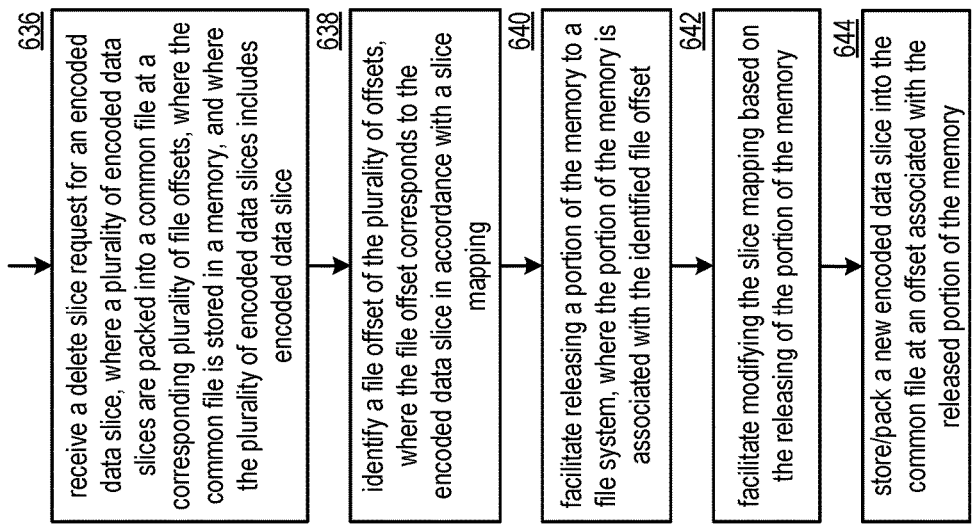
FIG. 11 is a flowchart illustrating an example of efficiently storing encoded data slices in accordance with the present invention.

Referring next to FIGS. 9-11, various embodiments that provide efficient resource reclamation after deletion of one or more encoded slices, where the deleted slices that have been packed together with other encoded data slices in a common file, will be discussed. In some such embodiments, "hole-punching" is used. Hole punching allows a non-sparse file, from which an internal data element has been deleted, to be made sparse again.

For example, consider a file containing 10 slices, each 100 KB in size, at offsets within the file from 0 to 99,999; 100,000 to 199,999; 200,000 to 299,999; 300,000 to 399, 999; 400,000 to 499,999; 500,000 to 599,999; 600,000 to 699,999; 700,000 to 799,999; 800,000 to 899,999 and 900, 000 to 999,999, resulting in a 1 MB file. Hole-punching the file can be performed at any range within the file, which will have the effect of freeing the underlying blocks used for the file back to the file system, such that they can be re-used by the file system for the storage of other data.

Thus, if the third slice is deleted, then the range 200,000 to 299,999 can be hole-punched, thus freeing 100 KB worth of data back to the file system and making the file sparse again, i.e., as if the file had never received any writes within that range. Attempted reads to that range may return pre-defined data such as all zeros. If another slice is written in the future, it may be written to the end of the file, or if it fits within that hole-punched segment, may be written within the area where the third slice used to exist (in the offset range of 200,000 to 299,999 within that file). Using hole punching to handle deletion of encoded data slices packed into a common file can permit immediate reclamation of storage resources, unlike techniques that simply mark a portion of the file as deleted. Hole punching can also avoid an excessive number of input/output (I/O) operations, which can result from having to re-write undeleted data to another file.

Various embodiments can also employ a technique referred to herein as "range collapse," which is similar to hole-punching, but instead of leaving an empty gap shifts the offsets of everything after the hole punched file. For example, hole punching a packed common file could produce the following result if encoded data slice C, originally stored in the range of 200,000 to 299,999, was deleted from within the file:
000,000 to 099,999: Slice A
100,000 to 199,999: Slice B
200,000 to 299,999: -------
300,000 to 399,999: Slice D
400,000 to 499,999: Slice E
500,000 to 599,999: Slice F
600,000 to 699,999: Slice G
700,000 to 799,999: Slice H
800,000 to 899,999: Slice I
900,000 to 999,999: Slice J By contrast, using "range-collapsing" after deletion of the encoded data slice C, originally stored in the common file at the range 200,000 to 299,999, would result in shrinking the file size of the common file from 1 MB to 900 KB, as follows:
000,000 to 099,999: Slice A
100,000 to 199,999: Slice B
200,000 to 299,999: Slice D
300,000 to 399,999: Slice E
400,000 to 499,999: Slice F
500,000 to 599,999: Slice G
600,000 to 699,999: Slice H
700,000 to 799,999: Slice I
800,000 to 899,999: Slice J Note that in the above example, the range occupied by slice C is freed back to the file system, and then the range is collapsed, such that the next offset after slice B will be the next slice following the end of the collapsed range.

FIG. 9-10 are schematic block diagrams of another embodiment of a dispersed storage network (DSN) that includes a distributed storage and task (DST) execution (EX) unit set 630, the network 24 of FIG. 1, and the DST processing unit 616, which can of be implemented using one of the computing devices 12, 14, or 16 of FIG. 1. The DST execution unit set 630 includes a set of DST execution units 1-$n$. Each DST execution unit includes at least one memory 88, configured to store encoded data slices. Each DST execution unit may be implemented utilizing the storage unit 36 of FIG. 1. The DSN functions to efficiently store encoded data slices, where data is dispersed storage error encoded utilizing an information dispersal algorithm (IDA) function to produce a plurality of sets of encoded data slices for storage in the DST execution unit set.

FIG. 9 illustrates an example of operation of the efficient storage of the encoded data slices where the DST processing unit 616 sends, via the network 24, access requests that includes each set of the plurality of sets of encoded data slices to the set of DST execution units 1-$n$ for storage of the plurality of sets of encoded data slices. In at least one embodiment, an access request can include a read-slice request or a write-slice request. Each DST execution unit may store an encoded data slice (e.g., associated with a common pillar) of two or more sets of encoded data slices as a group of encoded data slices in a common file within a file system of the DST execution unit.

The DST execution unit stores each encoded data slice of the group of encoded data slices at a unique file offset within the common file in the memory 88 of the DST execution unit and produces local slice mapping information within the file system of the DST execution unit to associate each encoded data slice with a corresponding unique file offset. For example, the set of DST execution units 1-$n$ stores a set of encoded data slices A1, A2, through An at a file offset of 0 within a file 1 in the memory 88 of each of the DST execution units, stores another set of encoded data slices B1, B2, through Bn at a file offset of 1 within the file 1 in the memory 88 of each of the DST execution units, stores yet another set of encoded data slices C1, C2, through Cn at a file offset of 2 within the file 1 in the memory 88 of each of the DST execution units, and stores a further set of encoded data slices D1, D2, through Dn at a file offset of 3 within the file 1 in the memory 88 of each of the DST execution units.

Having stored the encoded data slices in the set of DST execution units 1-$n$, each DST execution unit receives another access request that includes a delete slice request, where the delete slice request includes a slice name corresponding to a stored encoded data slice for deletion. The receiving includes receiving the delete slice request and interpreting the delete slice request to extract the slice name. For the example, the DST execution unit 1 receives another access request 1 that includes a delete slice request for encoded data slice B1.

Having received the delete slice request, the DST execution unit identifies a corresponding file identifier and file offset based on the slice name and the local slice mapping information. For example, the DST execution unit 1 identifies the file 1 and offset 1 corresponding to the encoded data slice B1 based on the local slice mapping information.

FIG. 10 illustrates further steps of the example of operation of the efficient storage of the encoded data slices where the DST execution unit facilitates releasing a portion of memory corresponding to storage of the encoded data slice of the delete slice request based on the file identifier and the file offset. The facilitating includes identifying the portion of the memory based on the file identifier and the file offset. For example, the DST execution unit 1 utilizes the file identifier 1 and the file offset 1 to access a file system table to retrieve an identifier for the portion of the memory (e.g., a physical memory designator for the memory 88, a block identifier, a track identifier, etc.) and issues a memory release request to a file system, where the memory release request includes the identifier of the portion of the memory. As such, a memory usage efficiency improvement may be provided by freeing up the portion of the memory for subsequent utilization (e.g., utilization for storage of a subsequently received encoded data slice for storage).

Having facilitated the releasing of the portion of the memory corresponding to the storage of the encoded data slice, the DST execution unit facilitates modifying the local slice mapping information based on the releasing of the portion of the memory to produce updated local slice mapping information in accordance with a modification approach. The modification approach includes one of hole punching and range collapsing. The modifying may include selecting the modification approach (e.g., interpreting a request, interpreting a predetermination). As a specific example, when the range collapsing approach is utilized, the DST execution unit reassigns the file offset to a next encoded data slice of the common file (e.g., associate a physical memory location of a next portion of the memory corresponding to the next encoded data slice over to the file offset; i.e., encoded data slice C1 is associated with file offset 1) and reassigns each subsequent file offset to a corresponding next encoded data slice through a last utilized of said associated with a last encoded data slice (i.e., encoded data slice D1 is associated with file offset 2). The modifying may further include indicating that a new last offset is available (e.g., file offset 3). As another specific example, when the hole punching approach is utilized, the DST execution unit indicates that the portion of the memory associated with the file offset 1 is available for subsequent reassignment.

FIG. 11 is a flowchart illustrating an example of efficiently storing encoded data slices. The method includes step 636 where a processing module of a storage unit (e.g., of a distributed storage and task (DST) execution unit) receives a delete slice request for encoded data slice, where a plurality of encoded data slices are packed into a common file at a corresponding plurality of file offsets, where the common file is stored in a memory, and where the plurality of encoded data slices includes the encoded data slice. The receiving includes interpreting the delete slice request to extract a slice name of the encoded data slice.

The method continues at step 638 where the processing module identifies a file offset of the plurality of offsets, where the file offset corresponds to the encoded data slice in accordance with a slice mapping. For example, the processing module performs a lookup within the slice mapping utilizing the slice name to identify one or more of a filename of the common file and the file offset corresponding to the slice name.

The method continues at step 640 where the processing module facilitates releasing a portion of the memory to a file system, where the portion of the memory is associated with the identified file offset. For example, the processing module issues a release memory request to the file system, where the release memory request includes one or more of a filename of the common file, the file offset, and an identified portion of the memory that corresponds to storage of encoded data slice.

The method continues at step 642 where the processing module facilitates modifying the slice mapping based on the releasing of the portion of the memory. The facilitating may include selecting a modification approach (e.g., hole punching, range collapsing) based on one or more of the request, interpreting a portion of system registry information, a storage efficiency indicator, and a storage efficiency goal. The facilitating further includes implementing the selected modification approach. As a specific example, when the selected approach includes the hole punching approach, the processing module implements the modification approach by indicating that the portion of the memory associated with the file offset is available for new use. As another specific example, when the selected approach includes the range collapsing approach, the processing module implements the modification approach by re-associating each subsequent sequential encoded data slice with a decremented file offset value.

As illustrated at step 644, in response to receiving a write-slice request indicating a new encoded data slice is to be stored by the DST EX unit, the new encoded data slice can be written into the common file at a file offset associated with the portion of the DS memory that was released. In various embodiments, this can be ant the end of the file, where range collapsing is used, or at an empty range within the file where hole punching is used.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for use in a distributed storage network (DSN) employing one or more distributed storage task execution (DST EX) units for dispersed storage of encoded data slices, the method comprising:
receiving, at a DST EX unit, a delete-slice request associated with a first encoded data slice packed into a common file with other encoded data slices, wherein:
the common file being stored in a distributed storage (DS) memory included in the DST EX unit, and
each encoded data slice packed into the common file is associated with a file offset within the common file;
identifying, by the DST EX unit, a particular file offset within the common file, the particular file offset associated with the first encoded data slice; and
facilitating, by the DST EX unit, releasing a portion of the DS memory to a file system maintained by the DST EX unit, wherein the portion of the DS memory is associated with the particular file offset within the common file.

2. The method of claim 1, wherein facilitating includes:
passing an indication to the file system that the portion of the DS memory associated with the particular file offset within the common file is available.

3. The method of claim 1, wherein facilitating includes:
re-associating file offsets associated with subsequent encoded data slices, the subsequent encoded data slices associated with file offsets, within the common file, subsequent to the particular file offset; and
wherein re-associating the file offsets includes associating the subsequent encoded data slices with a decremented file offset.

4. The method of claim 1, wherein facilitating includes:
issuing a release-memory request to the file system, wherein the release-memory request includes one or more of: a file name of the common file, a file offset, or an identified portion of the DS memory that corresponds to a storage location of the encoded data slice.

5. The method of claim 1, wherein identifying the particular file offset includes:
performing a lookup within a slice mapping table using a slice name to identify at least one of a filename of the common file, or the particular file offset corresponding to the slice name.

6. The method of claim 1, further comprising:
interpreting the delete-slice request to extract a slice name of the first encoded data slice.

7. The method of claim 1, further comprising:
receiving a write-slice request indicating a new encoded data slice is to be stored by the DST EX unit; and
writing the new encoded data slice into the common file at a file offset associated with the portion of the DS memory that was released.

8. A distributed storage task execution (DST EX) unit comprising:
a processor and associated memory;
a distributed storage (DS) memory coupled to the processor and associated memory, the DS memory configured to store encoded data slices;
a network interface coupled to the processor and associated memory, the network interface configured to receive, from a distributed storage network (DSN), a delete-slice request associated with a first encoded data slice packed into a common file with other encoded data slices, wherein:
the common file is stored in the DS memory, and
each encoded data slice packed into the common file is associated with a file offset within the common file;
the processor and associated memory configured to:
identify a particular file offset within the common file, the particular file offset associated with the first encoded data slice; and
facilitate releasing a portion of the DS memory to a file system maintained by the DST EX unit, wherein the portion of the DS memory is associated with the particular file offset within the common file.

9. The distributed storage task execution (DST EX) unit of claim 8, the processor and associated memory configured to facilitate releasing a portion of the DS memory to a file system by:
facilitate releasing a portion of the DS memory to a file system by passing an indication to the file system that the portion of the DS memory associated with the particular file offset within the common file is available.

10. The distributed storage task execution (DST EX) unit of claim 8, the processor and associated memory further configured to:
re-associate file offsets associated with subsequent encoded data slices, the subsequent encoded data slices associated with file offsets, within the common file, subsequent to the particular file offset; and
wherein re-associating the file offsets includes associating the subsequent encoded data slices with a decremented file offset.

11. The distributed storage task execution (DST EX) unit of claim 8, the processor and associated memory further configured to:
issue a release-memory request to the file system, wherein the release-memory request includes one or more of: a file name of the common file, a file offset, or an identified portion of the DS memory that corresponds to a storage location of the encoded data slice.

12. The distributed storage task execution (DST EX) unit of claim 8, wherein the processor and associated memory further configured to:
perform a lookup within a slice mapping table using a slice name to identify at least one of a filename of the common file, or the particular file offset corresponding to the slice name.

13. The distributed storage task execution (DST EX) unit of claim 8, the processor and associated memory further configured to:
interpret the delete-slice request to extract a slice name of the first encoded data slice.

14. The distributed storage task execution (DST EX) unit of claim 8, wherein:
the network interface is further configured to receive a write-slice request indicating a new encoded data slice is to be stored by the DST EX unit; and
the processor and associated memory are further configured to write the new encoded data slice into the common file at a file offset associated with the portion of the DS memory that was released.

15. A distributed storage network (DSN) comprising:
a distributed storage task (DST) processing unit;

a DSN memory coupled to the DST processing unit, the DSN memory including a set of distributed storage task execution (DST EX) units used for dispersed storage of encoded data slices, at least one DST EX unit configured to:
   receive, from the DST processing unit, a delete-slice request associated with a first encoded data slice packed into a common file with other encoded data slices, wherein:
      the common file is stored in a distributed storage (DS) memory included in the at least one DST EX unit, and
      each encoded data slice packed into the common file is associated with a file offset within the common file;
   identify a particular file offset within the common file, the particular file offset associated with the first encoded data slice; and
   facilitate releasing a portion of the DS memory to a file system maintained by the at least one DST EX unit, wherein the portion of the DS memory is associated with the particular file offset within the common file.

16. The distributed storage network (DSN) of claim 15, wherein the at least one DST EX unit is configured to:
   pass an indication to the file system that the portion of the DS memory associated with the particular file offset within the common file is available.

17. The distributed storage network (DSN) of claim 15, wherein the at least one DST EX unit is configured to:
   re-associate file offsets associated with subsequent encoded data slices, the subsequent encoded data slices associated with file offsets, within the common file, subsequent to the particular file offset; and
   wherein re-associating the file offsets includes associating the subsequent encoded data slices with a decremented file offset.

18. The distributed storage network (DSN) of claim 15, wherein the at least one DST EX unit is configured to:
   issue a release-memory request to the file system, wherein the release-memory request includes one or more of: a file name of the common file, a file offset, or an identified portion of the DS memory that corresponds to a storage location of the encoded data slice.

19. The distributed storage network (DSN) of claim 15, wherein the at least one DST EX unit is configured to:
   perform a lookup within a slice mapping table using a slice name to identify at least one of a filename of the common file, or the particular file offset corresponding to the slice name.

20. The distributed storage network (DSN) of claim 15, wherein the at least one DST EX unit is configured to:
   interpret the delete-slice request to extract a slice name of the first encoded data slice.

* * * * *